(12) United States Patent
Tsunomura et al.

(10) Patent No.: US 9,024,174 B2
(45) Date of Patent: May 5, 2015

(54) SOLAR CELL MODULE

(75) Inventors: Yasufumi Tsunomura, Kobe (JP);
Yukihiro Yoshimine, Kobe (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 904 days.

(21) Appl. No.: 11/946,182

(22) Filed: Nov. 28, 2007

(65) Prior Publication Data
US 2008/0121266 A1 May 29, 2008

(30) Foreign Application Priority Data

Nov. 29, 2006 (JP) .................. 2006-322097

(51) Int. Cl.
H01L 31/042 (2014.01)
H01L 31/05 (2014.01)
H05K 3/32 (2006.01)
H01L 31/0747 (2012.01)

(52) U.S. Cl.
CPC ............ *H01L 31/0512* (2013.01); *H05K 3/323* (2013.01); *H01L 31/0747* (2013.01); *Y02E 10/542* (2013.01); *H01L 31/0516* (2013.01)

(58) Field of Classification Search
CPC . H01L 31/0747; H01L 31/0512; H05K 3/323
USPC ........................................................ 136/244
See application file for complete search history.

(56) References Cited

U.S. PATENT DOCUMENTS 5,726,065 A * 3/1998 Szlufcik et al. ................. 438/57
6,204,443 B1 * 3/2001 Kiso et al. ..................... 136/259

2005/0098338 A1  5/2005 Kitae et al.
2005/0115602 A1 * 6/2005 Senta et al. .................... 136/250
2005/0199279 A1 * 9/2005 Yoshimine et al. ........... 136/251

(Continued)

FOREIGN PATENT DOCUMENTS

EP     1542290 A1   6/2005
JP     11-061060    3/1999

(Continued)

OTHER PUBLICATIONS

JP2007-158302, Shimizu, Machine Translation, Jun. 2007.*

(Continued)

*Primary Examiner* — Devina Pillay
(74) *Attorney, Agent, or Firm* — Marvin A. Motsenbocker; Mots Law, PLLC

(57) ABSTRACT

A solar cell module includes: two solar cells that has a photoelectric conversion part 10 which has first and second main faces, a first electrode 20 that is provided on the first main face and that is made of conductive paste, and a second electrode that is provided on any one of the first and second main faces and that has a polarity opposite to that of the first electrode 20; a wiring member 40 for electrically connecting the first electrode 20 of one solar cell of the two solar cells to the second electrode of the other solar cell; and a connection layer 80 that is provided between the first electrode 20 and the wiring member 40 and that is made of resin 60 including a plurality of conductive particles 70. The first electrode 20 is electrically connected to the wiring member 40 by the conductive particles 70. A surface of the first electrode 20 having a contact with the connection layer 80 has a concavo-convex shape. The conductive particles 70 protrude from the concave section at the surface of the first electrode 20.

17 Claims, 4 Drawing Sheets

(56) References Cited

U.S. PATENT DOCUMENTS

| | | | |
|---|---|---|---|
| 2006/0174934 A1 | 8/2006 | Sager et al. | |
| 2006/0219292 A1* | 10/2006 | Asaumi et al. | 136/252 |
| 2007/0116961 A1* | 5/2007 | Connell et al. | 428/413 |
| 2007/0295381 A1* | 12/2007 | Fujii et al. | 136/244 |

FOREIGN PATENT DOCUMENTS

| | | | |
|---|---|---|---|
| JP | 2002-076398 | 3/2002 | |
| JP | 2003-082318 | 3/2003 | |
| JP | 2005-217148 | 8/2005 | |
| JP | 2005-244171 | 9/2005 | |
| JP | 2005-252062 | 9/2005 | |
| JP | WO2005093855 * | 11/2005 | |
| JP | 2006-206843 * | 8/2006 | C09J 7/02 |
| JP | 2007-158302 | 6/2007 | |
| JP | 2007-214533 | 8/2007 | |
| WO | WO 2005/093855 A1 * | 11/2005 | H01L 31/04 |

OTHER PUBLICATIONS

JP2003-082318, Yamaguchi, Machine Translation, Mar. 2003.*

Fujii, JP2006-206843, Machine Translation, Aug. 2006.*

* cited by examiner

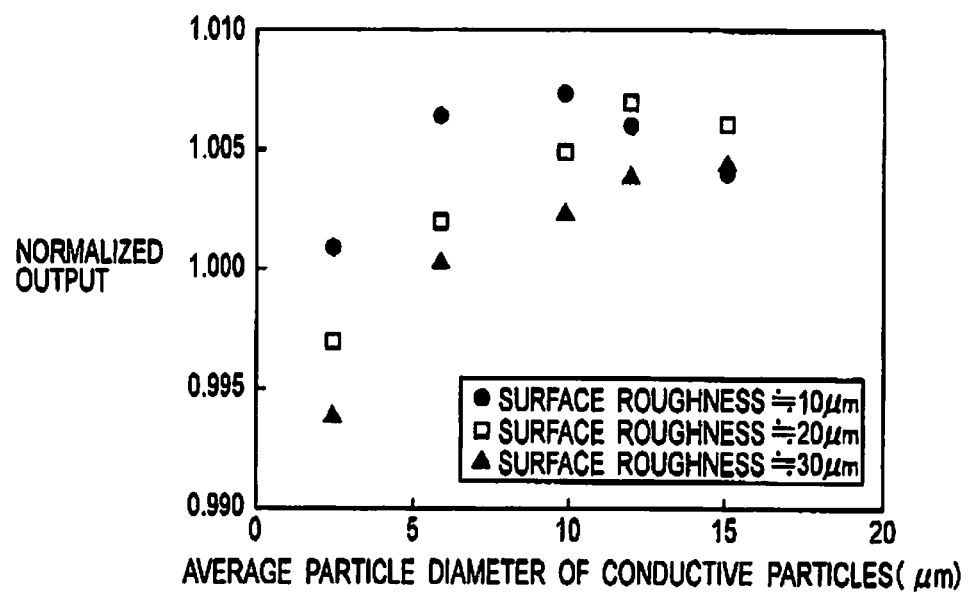
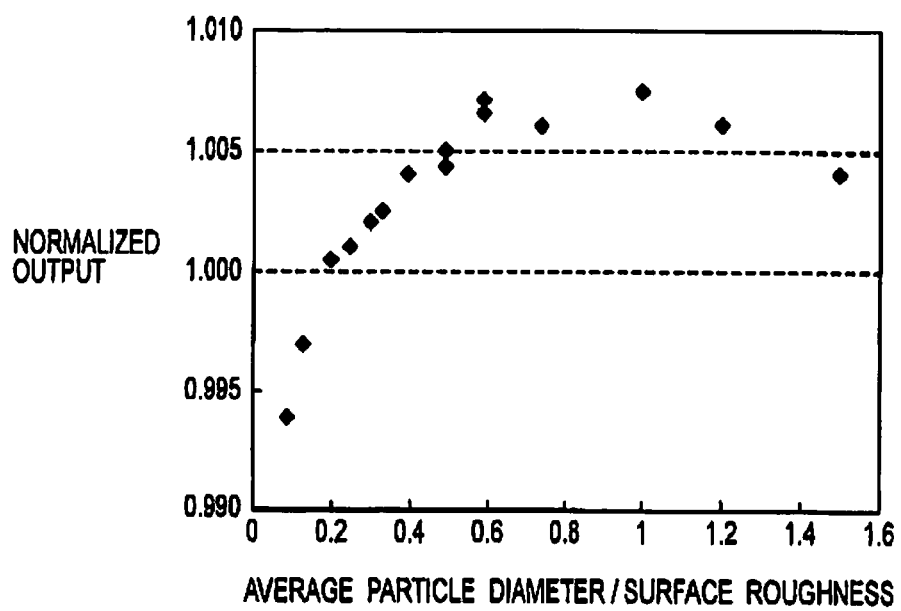

SOLAR CELL MODULE

CROSS REFERENCE TO RELATED APPLICATION

This application is based upon and claims the benefit of priority from the prior Japanese Patent Application No. P 2006-322097, filed on Nov. 29, 2006; the entire contents of which are incorporated herein by reference.

BACKGROUND OF THE INVENTION

1. Field of the Invention

The present invention relates to a solar cell module in which connection electrodes of a plurality of solar cells are mutually electrically connected by a wiring member.

2. Description of the Related Art

Conventionally, in the solar cell module, the connecting electrodes of a plurality of solar cells are electrically interconnected by wiring members made from a conductive material such as copper foil. The solar cells are sealed with a translucent sealing member made of EVA (Ethylene Vinyl Acetate) or the like, between a acceptance face protective member made of glass, translucent plastic, or the like and a back face protective member made from a film of PET (Poly-Ethylene Terephthalate) or the like.

In the solar cell, a pair of electrodes for output extraction is formed on main faces of a photoelectric conversion part. In general, the pair of electrodes is formed on the acceptance face and back face of the photoelectric conversion part, respectively. In this case, the electrode provided on the acceptance face is formed into a comb-like shape having a plurality of finger electrodes and a bus-bar electrode formed of a conductive paste. The wiring member is bonded by a solder onto the bus-bar electrode provided on the acceptance face of one solar cell and onto the bus-bar electrode provided on the back face of another solar cell, whereby a plurality of solar cells are connected in series (for example, see Japanese Patent Laid-Open No. 3754208).

Conventionally, when a wiring member is connected to a bus-bar electrode by soldering, flux is firstly coated on the surface of the bus-bar electrode or the cell-side surface of the wiring member. Then, the wiring member is placed on the bus-bar electrode and is heated. As a result, the solder layer on the surface of the wiring member and the metal part in the bus-bar electrode are alloyed and the bus-bar electrode is adhered to the wiring member with a favorable adhesive force.

BRIEF SUMMARY OF THE INVENTION

The present invention has been made in order to solve the disadvantages as described above, and an object thereof is to provide a solar cell module that reduces the electric resistance between the electrode of the solar cell and the wiring member to suppress the output from being reduced.

A first aspect of the present invention is the provision of a solar cell module, comprising: two solar cells, each including: a photoelectric conversion part which has first and second main faces; a first electrode that is provided on the first main face and that is made of conductive paste; and a second electrode that is provided on any one of the first and second main faces and that has a polarity opposite to that of the first electrode; a wiring member for electrically connecting the first electrode of one solar cell of the two solar cells to the second electrode of the other solar cell; and a connection layer that is provided between the first electrode and the wiring member and that is made of resin including a plurality of conductive particles, wherein: the first electrode is electrically connected to the wiring member by the conductive particles, a surface of the first electrode having a contact with the connection layer has a concavo-convex shape, and the conductive particles protrudes from a concave section at the surface of the first electrode.

A second aspect of the present invention is related to the first aspect of the present invention, and is summarized in that, in a range of 1 mm of the surface of the first electrode appearing in a cutting plane perpendicular to the surface of the first electrode, a value obtained by dividing an average particle diameter of the conductive particles determined by an average value of a major axis of the conductive particles by a surface roughness of the first electrode determined by a ten points average height is within a range of 0.2 or more and 1.5 or less.

A third aspect of the present invention is related to the first aspect of the present invention, and is summarized in that a value obtained by dividing the average particle diameter of the conductive particles by the surface roughness of the first electrode is within a range of 0.5 or more and 1.2 or less.

A fourth aspect of the present invention is related to the first aspect of the present invention, and is summarized in that the surface of the wiring member having a contact with the connection layer has thereon a layer softer than the conductive particle.

BRIEF DESCRIPTION OF THE SEVERAL VIEWS OF THE DRAWINGS

FIG. 5 is a graph plotting a normalized output with an average particle diameter of conductive particles 70 on the horizontal axis with regards to each surface roughness of the bus-bar electrode 20.

FIG. 6 is a graph illustrating normalized outputs by plotting, on the horizontal axis, values obtained by dividing an average particle diameter of the conductive particles 70 by the surface roughness of the collecting electrode defined by the ten points average height (average particle diameter/surface roughness).

DETAILED DESCRIPTION OF THE INVENTION

Figure 1:
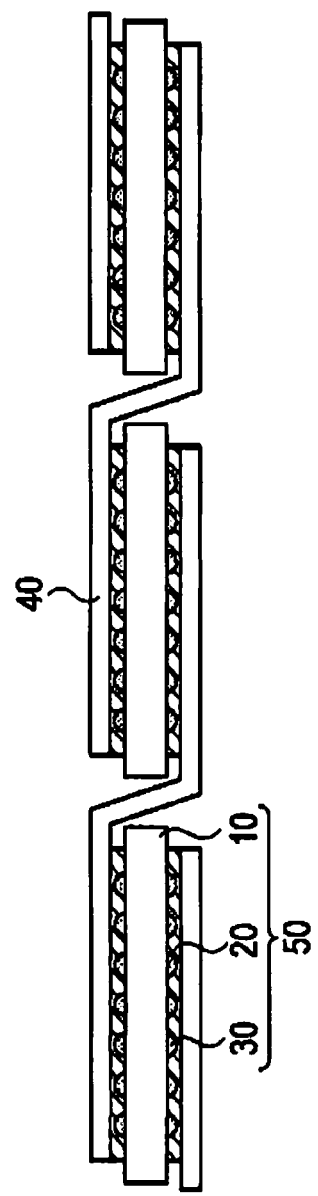
FIG. 1 is a cross-sectional view illustrating the structure of a solar cell module according to an embodiment of the present invention taken along an I-I cutting plane of FIG. 2.

Hereinafter, embodiments of the present invention will be described with reference to the drawings. In the drawings, the same components are denoted with the same reference numerals.

With reference to FIG. 1, the structure of a solar cell module according to the present invention will be described. The solar cell module includes a plurality of (for example, three) solar cells 50. Each of the solar cells 50 is connected to other neighboring solar cells 50 via a wiring member 40 which is formed from copper foil with tinned surfaces. The solar cell 50 includes: a photoelectric conversion part 10 that generates photogenerated carriers by the incidence of light; and a pair of positive and negative electrodes for correcting photogenerated carriers generated by the photoelectric conversion part 10.

The pair of positive and negative electrodes is generally arranged at an acceptance face and a back face of the photoelectric conversion part 10, respectively. In this case, the pair of positive and negative electrodes, those provided on the acceptance faces is formed into, for example, a comb-like shape by a combination of a plurality of finger electrodes 30 having a narrow-width and at least one bus-bar electrode 20 having a wide-width, in order to make an area that blocks incident light as small as possible. The plurality of finger electrodes 30 is electrodes for collecting the photogenerated carriers generated in the photoelectric conversion parts 10. For example, the linear finger electrodes 30 each having a width of approximately 100 um are arrayed at intervals of 2 mm across almost the entire acceptance faces of the photoelectric conversion parts 10, respectively. Moreover, the bus-bar electrodes 20 are electrodes for collecting the photogenerated carriers collected by the plurality of finger electrodes 30. For example, each of the bus-bar electrodes 20 is formed into a linear shape with a width of approximately 1 mm so as to intersect with all the finger electrodes 30. The number of each of the bus-bar electrodes 20 is appropriately set, with consideration given to the size and resistance of a solar cell.

In addition, since the other-polarity electrodes are generally provided on the back faces of the photoelectric conversion parts 10, incident light does not need to be taken into account. Accordingly, the other-polarity electrodes may be formed so as to cover almost the entire back faces of the photoelectric conversion parts 10, or may be each formed into a comb-like shape similarly to the electrodes on the acceptance side.

In the case where the other-polarity electrodes are formed so as to cover almost the entire back faces of the photoelectric conversion parts 10, a "first main face" of each of the photoelectric conversion parts 10 corresponds to the acceptance face, and a "second main face" thereof corresponds to the back face. On the other hand, in the case where the other-polarity electrode is formed into a comb-like shape on the back face of each of the photoelectric conversion parts 10 similarly to the electrodes on the acceptance side, the "first main face" and "second main face" may be any of the acceptance face and the back face.

Additionally, in some solar cells, both of the pair of positive and negative electrodes are provided on the back face of the photoelectric conversion part 10. In this case, each of the pair of positive and negative electrodes provided on the back face of the photoelectric conversion part 10 is formed into a comb-like shape having a plurality of finger electrodes and at least one bus-bar electrode. In this case, a "first main face" of each of the photoelectric conversion parts 10 corresponds to the back face, and a "second main face" thereof corresponds to the acceptance face.

The present invention does not restrict the faces where the pair of positive and negative electrodes is provided. However, in the present embodiment, description will be given of the solar cells each having the pair of positive and negative electrodes on the acceptance face and back face of the photoelectric conversion part 10, respectively. Moreover, the present invention does not restrict the shape of the electrode provided on the back face of each of the photoelectric conversion part 10. However, description will be given, as an example, of the solar cells including the plurality of finger electrodes and bus-bar electrodes also on the back face of the photoelectric conversion part 10.

The solar cell 50 includes the photoelectric conversion part 10 that generate photogenerated carriers by light-receiving on the acceptance face; and the finger electrode 30 and the bus-bar electrode 20 that collect photogenerated carriers generated by the photoelectric conversion part 10. Although not shown, the plurality of solar cells 50 is sealed with a translucent sealing member made of EVA or the like, between a translucent front protective member made of glass, translucent plastic, or the like and a back protective member. The back protective member is made from a PET (or the like) film or a laminated material obtained by sandwiching a thin metal (such as aluminum) film between PET (or the like) films, or the like.

Figure 2:
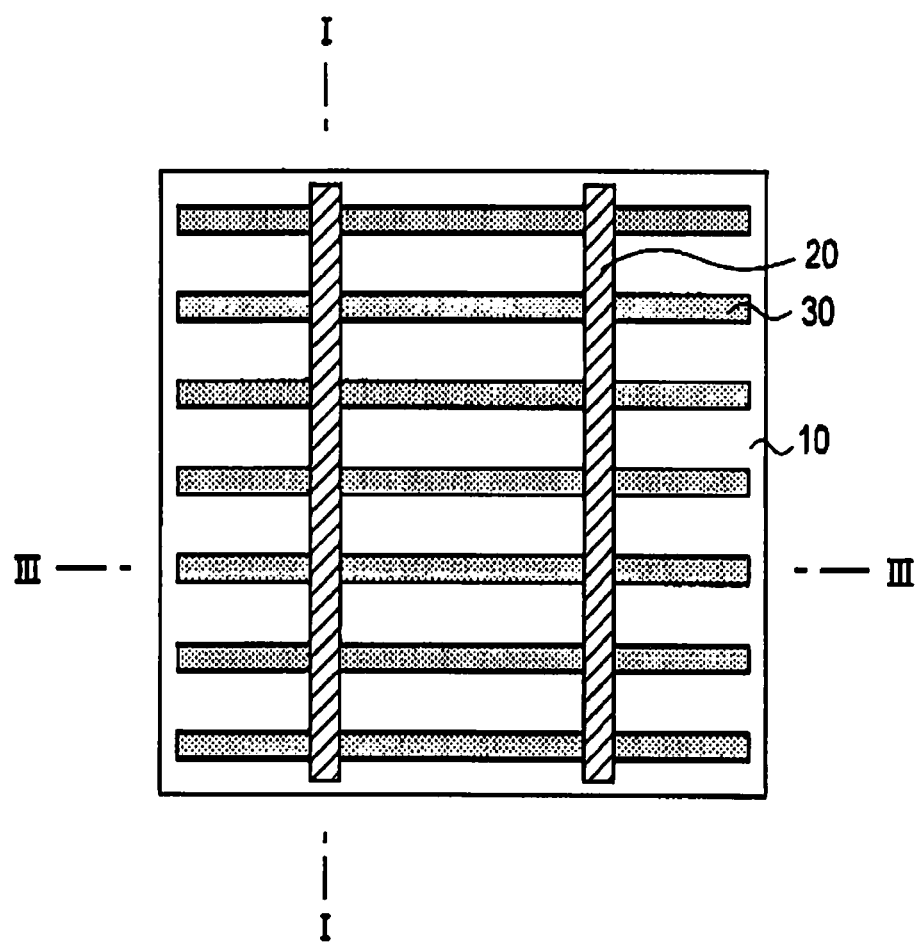
FIG. 2 is an expanded plan view of a solar cell 50 composing the solar cell module of FIG. 1.

With reference to FIG. 2, the following section will describe the planar structure of the solar cell 50 composing the solar cell module of FIG. 1. In the embodiment of the present invention, the solar cell 50 having a HIT structure will be exemplarily described.

The plurality of linear finger electrodes 30 are arrayed on the surface of the photoelectric conversion parts 10, respectively, in parallel with each other at uniform intervals. The bus-bar electrodes 11*a* and 11*b* are placed in the direction orthogonal to the finger electrodes 21*a* and 21*b*, respectively.

On the surface of the photoelectric conversion part 10, there are arranged the plurality of the finger electrodes 30 for collecting photogenerated carriers generated by the photoelectric conversion part 10; and the bus-bar electrodes 20 connected to the plurality of the finger electrodes 30. The plurality of linear finger electrodes 30 is arranged on the surface of the photoelectric conversion part 10, respectively, in parallel with each other at uniform intervals. The bus-bar electrodes 20 are arranged in a direction perpendicular to the finger electrodes 30 and further collect photogenerated carriers collected by the plurality of finger electrodes 30. The finger electrodes 30 and the bus-bar electrodes 20 that collect photogenerated carriers generate by the photoelectric conversion part 10 will be collectively called as a "collector electrodes". The collector electrodes are formed of, for example, thermosetting conductive resin containing epoxy resin as binder and conductive particles as filler. Note, however, that these are not restrictive. FIG. 1 is a cross-sectional view taken along the I-I cutting plane of FIG. 2.

Figure 3:
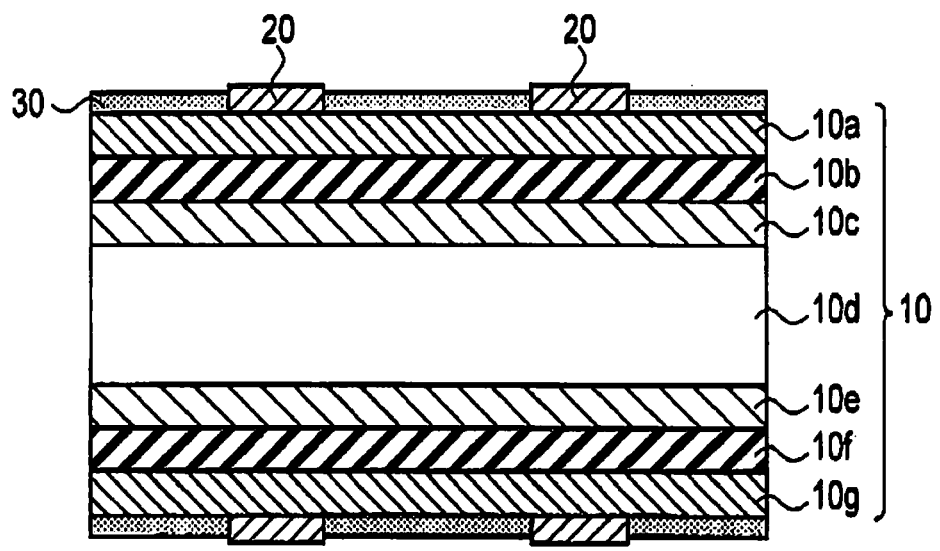
FIG. 3 is a cross-sectional view illustrating the layered structure of the solar cell 50 of FIG. 2 taken along a III-III cutting plane.

With reference to FIG. 3, the following section will describe the layered structure of the solar cell 50 of FIG. 2. FIG. 3 is a cross-sectional view illustrating the solar cell 50 taken along the III-III cutting plane of FIG. 2. As described above, the solar cell 50 includes: the photoelectric conversion part 10 having a layered structure composed of a plurality of layers (10*a* to 10*g*); and collector electrodes (i.e., the finger electrode 30 and the bus-bar electrode 20) provided on the upper and lower faces of the photoelectric conversion part 10.

The photoelectric conversion part 10 includes: an n-type single-crystalline silicon substrate 10*d*; an i-type amorphous silicon layer 10*c* provided on the upper face of a substrate 10*d*; a p-type amorphous silicon layer 10*b* provided on the upper face of an i-type amorphous silicon layer 10*c*, an ITO film 10*a* provided on the upper face of the p-type amorphous silicon layer 10*b*; an i-type amorphous silicon layer 10*e* provided on the lower face of the n-type single-crystalline silicon substrate 10*d*; an n-type amorphous silicon layer 10*f* provided on the lower face of the i-type amorphous silicon layer 10*e*; and an ITO film 10*g* provided on the lower face of the n-type amorphous silicon layer 10*f*. The upper face of the ITO film 10*a* and the lower face of the ITO film 10*g* have thereon collector electrodes composed of the bus-bar electrodes 20 and the finger electrodes 30. The structure as described above in which the single-crystalline silicon layer (10*d*) and the amorphous silicon layer (10*b* and 10*f*) sandwich substantially intrinsic amorphous silicon layers (10*c* and 10*e*) that have a thickness substantially not contributing to power generation is called as a "HIT structure". The HIT structure reduces the crystal fault at the interface between the single-crystalline silicon layer and the amorphous silicon layer to improve the characteristic of the heterojunction interface (see Japanese Patent No. 2614561 for example).

Figure 4:
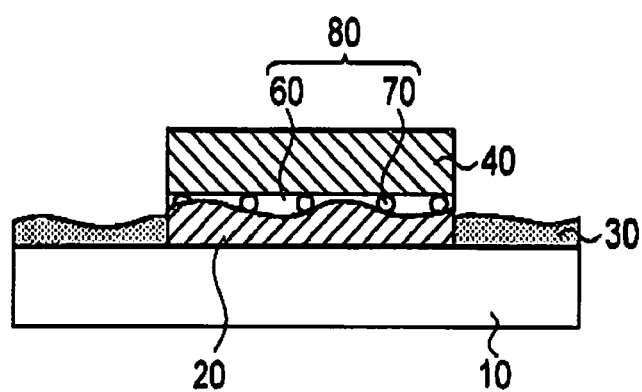
FIG. 4 is an expanded cross-sectional view illustrating a part at which a wiring member 40 is connected to a bus-bar electrode 20.

With reference to FIG. 4, the following section will describe a part at which the wiring member 40 is connected to the bus-bar electrode 20. The bus-bar electrode 20 and the wiring member 40 have therebetween an adhesion layer B0 composed of resin 60 including a plurality of conductive particles 70. The wiring member 40 20 is electrically connected to the bus-bar electrode via the conductive particles 70. The resin 60 bonds the wiring member 40 and the bus-bar electrode 20 together.

The resin 60 is epoxy-base thermosetting conductive resin for example. The conductive particles 70 are made of nickel for example. In FIG. 4, there are a plurality of conductive particles 70 having a contact with the bus-bar electrode 20 and the wiring member 40. The bus-bar electrode 20 is electrically connected to the wiring member 40 via the respective conductive particles 70.

The surface of the bus-bar electrode 20 having a contact with the connection layer so has a concavo-convex shape. The conductive particles 70 protrude from the concave sections at the surface of the bus-bar electrode 20. The parts at which the conductive particles 70 protrude are connected to the wiring member 40. Specifically, among the plurality of conductive particles 70 included in the connection layer 80, the conductive particles 70 placed on the concave sections of the surface of the bus-bar electrode 20 protrude to the wiring member 40 to have a height higher than the top of the surrounding convex sections. The part at which the conductive particles 70 protrude has a contact with the wiring member 40. The bus-bar electrode 20 electrically connected to the wiring member 40 via the conductive particles 70 in the manner as described above can reduce, when compared with a case by the conventional connection by soldering, the electric resistance between the bus-bar electrode 20 and the wiring member 40, thus suppressing the output of the solar cell module from being reduced.

Furthermore, the convex section of the bus-bar electrode 20 and the wiring member 40 have therebetween the resin 60. This improves the adhesive force between the bus-bar electrode 20 and the wiring member 40 and allows the conductive particles 70 to function as a spacer between the bus-bar electrode 20 and the wiring member 40. Thus, a distance between the bus-bar electrode 20 and the wiring member 40 can be controlled easily.

Note that, since the wiring member 40 is adhered by the resin 60, conductive particles 70 in the resin 60 preferably exist while being diffused.

The surface of the wiring member 40 having a contact with the connection layer 80 desirably has a layer softer than the conductive particles 70. In this embodiment, the wiring member 40 is made of metal such as copper foil and is surrounded by tin plating. This tin plating forms a layer softer than the nickel particles 70. As a result, a pressure caused when the wiring member 40 is connected to the bus-bar electrode 20 is absorbed by the layer (tin plating) softer than the conductive particles 70. The combination of the material of the top layer of the wiring member 40 and the material of the conductive particles 70 is not limited to the above combination of nickel and tin. Various combinations can be used based on the hardnesses of metal elements as shown in Table 1. Generally, hardnesses of materials can be measured and compared based on Brinell hardness, Rockwell hardness, Vickers hardness, or Mohs hardness for example. Table 1 shows Mohs hardnesses of main metal elements. When the conductive particles 70 are made of nickel, tin (Sn) or silver (Ag) softer than nickel can be used to plate the surface of the wiring member 40. The term "Mohs hardness" mainly means a scale for hardness of mineral substance and is measured by rubbing reference material with sample material for which the hardness is measured to measure the hardness with regards to existence or nonexistence of scratch(s).

TABLE 1

| ELEMENT | SYMBOL OF ELEMENT | MOHS HARDNESS |
|---|---|---|
| ZINC | Zn | 2.5 |
| ALUMINUM | Al | 2.9 |
| ANTIMONY | Sb | 3.0 |
| GOLD | Au | 2.5 |
| SILVER | Ag | 2.7 |
| CHROME | Cr | 9.0 |
| COBALT | Co | 5.5 |
| TIN | Sn | 1.8 |
| TUNGSTEN | W | 6.5-7.5 |
| TITANIUM | Ti | 6.0 |
| IRON | Fe | 4.5 |
| COPPER | Cu | 3.0 |
| LEAD | Pb | 1.5 |
| NICKEL | Ni | 3.5 |
| PLATINUM | Pt | 4.3 |
| MAGNESIUM | Mg | 2.0 |
| MANGANESE | Mn | 5.0 |
| MOLYBDENUM | Mo | 5.5 |

The conductive particles 70 are intended for the provision of sufficient electrical conductivity between the bus-bar electrode 20 and the wiring member 40. For the composition of the conductive particles 70, at least one kind of metal selecting from a group consisting of nickel, copper, silver, aluminum, tin, gold, and the like, or an alloy, a mixture, or the like of any of these metals can be applied. Moreover, at least one kind of metal-coated inorganic oxide selecting from a group consisting of alumina, silica, titanium oxide, glass, and the like may be applied. Alternatively, for the composition of the conductive particles 70, at least one kind of metal-coated resin selecting from a group consisting of epoxy resin, acrylic resin, polyimide resin, phenolic resin, urethane resin, silicone resin, and the like, or a metal-coated copolymer, mixture, or the like of any of these resins may be applied. As for the shape of the conductive particles 70, a spherical shape with a circular or an oval intersection taken along a center axis can be adopted. Moreover, a scheme to enhance the electrical conductivity can also be adopted, such as increasing the surface areas of the conductive particles 70 by making their surfaces rugged.

Preferably, the resin 60 is a material more flexible than the material used for the wiring member 40, for the purpose of lessening the stress occurred expansion and contraction by the temperature changes of the wiring member 40. With consideration given to the fact that the resin 60 bonds the wiring member 40, it is preferable to use a thermosetting resin material for the resin 60. Moreover, to maintain reliability, the resin 60 is required to have excellent resistance against humidity and high-temperature. Examples of a resin meeting these requirements include epoxy resin, acrylic resin, polyimide resin, phenolic resin, urethane resin, silicone resin, and the like. At least one kind of resin selecting from a group consisting of these resins, or a mixture, a copolymer, or the like of any of these resins can be applied to the resin 60. In terms of manufacture, epoxy resin or acrylic resin is preferably used, in point of the capability of setting at low temperature in a short time. Moreover, any of these resins for the resin 31 may be in the form of a film that can be deposited by heat.

Note that, although the collector electrodes (the finger electrode 30 and the bus-bar electrode 20) are formed of thermosetting conductive resin containing epoxy resin as binder and conductive particles as filler as described above, this is an example of the composition of the collector electrodes, and the present invention is not limited to this composition. For the composition of the filler in the collector electrodes, which is intended for the provision of electrical conductivity, at least one kind of metal selecting from a group consisting of copper, silver, nickel, aluminum, tin, gold, and the like, or an alloy, a mixture, or the like of any of these metals can be applied. As for the shape of the filler, a scheme to enhance the electrical conductivity can be adopted, such as mixing flake and spherical shapes, or mixing different sizes. Moreover, the binder in the collector electrodes, whose main purpose is to bond the filler, is required to have excellent resistance to humidity and high-temperature in order to maintain reliability. Examples of a material for the binder meeting such requirements include epoxy resin, acrylic resin, polyimide resin, phenolic resin, urethane resin, silicone resin, and the like. At least one kind of resin selecting from a group consisting of these resins, or a mixture, a copolymer, or the like of any of these resins can be applied to the binder. As for the proportions of the binder and the filler, it is preferable that the filler constitute 70% or more of the conductive resin by weight, with consideration given to electrical conductivity.

(Method for Manufacturing the Solar Cell Module)

Next, a method for manufacturing the solar cell module according to the present embodiment will be described.

First, a method for manufacturing the photoelectric conversion part 10 is similar to conventional methods, and therefore description thereof will be omitted here. Next, on the photoelectric conversion part 10, the bus-bar electrodes 20 and the finger electrodes 30 are formed using an epoxy thermosetting silver paste. Specifically, the silver paste is screen-printed on the acceptance face of the photoelectric conversion part 10 and then provisionally set by being heated at 150° C. for five minutes. Thereafter, the silver paste is screen-printed on the back face of the photoelectric conversion part 10 and then provisionally set by being heated at 150° C. for five minutes. Thereafter, the silver paste is completely set by being heated at 200° C. for one hour, whereby the solar cell 50 is formed.

Next, using a dispenser, an epoxy resin containing approximately 5% by volume of nickel particles is applied in a thickness of approximately 30 μm onto the bus-bar electrodes 20. After the resin 60 is applied in this manner onto both of the acceptance face side and the back face side of the photoelectric conversion part 10 of each of solar cells 50. Next, the wiring member 40 is placed on the applied resin 60 and heated at 200° C. for one hour while being pressurized at approximately 2 MPa, whereby a string is formed.

Next, each of a plurality of strings is connected. Glass, a sealing sheet, the plurality of strings, a sealing sheet, and a back sheet are stacked in this order and then, after brought in a vacuum, provisionally compressed together by thermocompression at 150° C. for ten minutes. Thereafter, this provisionally compressed body is completely set by being heated at 150° C. for one hour. Thereafter, a terminal box and a metal frame are attached, thus completing the solar cell module.

Although the above description has coated epoxy resin on the bus-bar electrode 20 and has placed the wiring member 40 on the epoxy resin, another structure also may be used in which a resin film including metal particles is provided on the bus-bar electrode 20 and the wiring member 40 is placed on the resin to provide a string.

EXAMPLE

The following section will specifically describe a solar cell module according to the present invention by way of an Example. However, the present invention is not limited to the Example and modifications also can be appropriately carried out within the scope not deviating from the intention.

As the solar cell 50 according to the Example of the present invention, the solar cell module shown in FIG. 1 to FIG. 4 was manufactured in the manner as described below. The following manufacture method will be described with regards to steps 1 to 4.

<Step 1> Formation of Photoelectric Conversion Part

First, the n-type single-crystalline silicon substrate 10d was prepared by cleaning the n-type single-crystalline silicon substrate 10d having a resistivity of about 1Ω·cm and a thickness of about 300 μm to remove impurities. Next, the RF plasma CVD method was used to form, on the upper face of the n-type single-crystalline silicon substrate 10d, the i-type amorphous silicon layer 10c having a thickness of about 5 nm and the p-type amorphous silicon layer 10b having a thickness of about 5 nm in this order. The i-type amorphous silicon layer 10c and the p-type amorphous silicon layer 10b were formed by the RF plasma CVD method based on specific conditions of a frequency of about 13.65 MHz, a formation temperature of about 100 to 250° C., a reaction pressure of about 26.6 to 80.0 Pa, and a RF power of about 10 to 100 W.

Next, on the lower face of the n-type single-crystalline silicon substrate 10d, the i-type amorphous silicon layer 10e having a thickness of about 5 nm and the n-type amorphous silicon layer 10f having a thickness of about 5 nm were formed in this order. The i-type amorphous silicon layer 10e and the n-type amorphous silicon layer 10f were formed by the same process as that for the i-type amorphous silicon layer 10c and the p-type amorphous silicon layer 10b.

Next, the magnetron sputter method was used to form the ITO films 10a and 10g having a thickness about 100 nm on the p-type amorphous silicon layer 10b and the n-type amorphous silicon layer 10f, respectively. The ITO films 10a and 10g were formed based on specific conditions of a formation temperature of about 50 to 250° C., a flow rate of Ar gas of about 200 sccm, a flow rate of O2 gas of about 50 sccm, a power of about 0.5 to 3 kW, and a magnetic field intensity of about 500 to 3000 Gauss.

<Step 2> Formation of Collecting Electrode

The screen print method was used to transfer epoxy-base thermosetting silver paste onto a predetermined region of the transparent conductive film of the light-receiving face. Then, the resultant structure was heated at 150° C. for 5 minutes and was temporarily cured. Then, the structure was heated at 200° C. for 1 hour to completely cure the paste, thereby providing a collecting electrode. As a result, the collecting electrode was formed that was composed of the plurality of finger electrodes 30 that were arranged on the upper face of the transparent conductive film (ITO film) to extend so as to be in parallel with one another while having a predetermined interval and the bus-bar electrodes 20 that collected current collected by the finger electrodes 30. In this example, the bus-bar electrode 20 had a width of about 1.0 mm and a height of about 50 μm.

<Step 3> Formation of String

First, a dispenser was used to coat epoxy-base thermosetting nickel paste on the bus-bar electrode 20. Specifically, epoxy-base thermosetting nickel paste was coated on the bus-bar electrode 20 to have a thickness of about 30 μm. The nickel paste included nickel particles with a volume ratio of about 5%.

First, nickel paste was coated on both of the light-receiving face and the back face to subsequently place, on the bus-bar electrode 20, a tin plating copper foil having a width of about 1.5 mm as the wiring member 40. Then, the plurality of solar cells 50 were arranged so as to be connected to one another. Then, each solar cell 50 was sandwiched by a heater from the upper and lower sides. Then, the solar cells 50 was heated at about 200° C. for 1 hour while being pressurized with 2 MPa to cure nickel paste, thereby providing a string. By the curing with a pressure as described above, nickel particle can be sandwiched between the tin plating copper foil and the bus-bar electrode 20. As a result, a favorable electric conduction was obtained. The nickel paste was also pressed to extend to have substantially the same width as that of the wiring member 40.

<Step 4> Modularization

Filling material composed of an EVA sheet was placed on surface protection material composed of a glass substrate. Then, the plurality of solar cells 50 connected by the wiring member 40 was placed on the resultant structure. Then, filling material composed of an EVA sheet was further placed on the structure. Then, back face protection member having a three layer-structure of PET/aluminum foil/PET was placed on the structure. The resultant structure was then placed in a vacuum atmosphere and was heated and compressed at 150° C. for 10 for temporal compression. Thereafter, the resultant structure was heated at 150° C. for 1 hour, thereby completely curing the structure. Thereafter, the structure was attached with a terminal box and a metal frame, thereby manufacturing a solar cell module according to an Example.

Comparison Example

A solar cell module according to a comparison example was manufactured by connecting a plurality of solar cells by conventional soldering adhesion.

<Step 1> A solar cell module was manufactured by the same method as that of Step 1 of the Example.

<Step 2> A solar cell module was manufactured by the same method as that of Step 2 of the Example. This solar cell module was formed so that a bus-bar electrode has a width of about 1.5 mm.

<Step 3> On the bus-bar electrode, a Sn—Ag—Cu solder plated copper foil having a width of about 1.5 mm was placed as a wiring member and the plurality of solar cells 50 were arranged so as to be connected to one another. Then, the bus-bar electrode is connected to the wiring member by soldering, thereby forming a string.

<Step 4> A solar cell module was manufactured by the same method as that of Step 4 of the Example.

Experimental Example

Based on the assumption that the concavo-convex shape at the surface of the bus-bar electrode 20 represents "surface roughness", an influence by the surface roughness of the bus-bar electrode 20 and an average particle diameter of the conductive particles 70 in the connection layer 60 on the output from the solar cell module was investigated by investors by an experiment as shown below.

The above manufacture method shown in the Example was used to prepare three types of solar cells 50 having the surface roughness of the bus-bar electrode 20 of about 10 μm, about 20 μm, and about 30 μm. The respective solar cells 50 were modularized by using the connection layers 80 having five average particle diameters of the conductive particles 70 of about 2.5 μm, about 6 μm, about 10 μm, about 12 μm, and about 15 μm. Specifically, 3×5=15 types of solar cell modules were prepared. These modules were adjusted so that the conductive particles 70 in the connection layer 80 had an equal volume ratio.

It was determined that "the surface roughness of the collecting electrode" including the bus-bar electrode 20 was an average value of the major axis of the conductive particles 70 within a range of the length of 1 mm of the surface of the collecting electrode appearing in the cutting plane perpendicular to the surface of collecting electrode. In other words, as specified in "JIS B0601", the surface roughness of a collecting electrode was determined by a ten points average height of a reference length of 1 mm in the cross section of the collecting electrode. In an actual case, the surface roughness of the bus-bar electrode 20 was measured by using SEM to observe the cross section of the bus-bar electrode 20 to assume, with regards to the concavo-convex shape of the surface of the bus-bar electrode 20, that a difference between an average value of the heights of the tops of the first highest to fifth highest convex sections and an average value of the heights of the bottoms of the first lowest to fifth lowest concave sections was "the surface roughness of the bus-bar electrode 20".

The surface roughness of the bus-bar electrode 20 was adjusted by changing the shape of the mesh (the number of the mesh, wire diameter) used when the bus-bar electrode 20 was screen-printed. Table 2 shows a relation between the surface roughness of the bus-bar electrode 20 and the mesh shape.

TABLE 2

| MESH SIZE OF SCREEN | | |
|---|---|---|
| NUMBER OF MESH/INCH | WIRE DIAMETER | SURFACE ROUGHNESS OF FINISHED ELECTRODE |
| 380 | ϕ14 μm | 10 μm |
| 290 | ϕ20 μm | 20 μm |
| 250 | ϕ30 μm | 30 μm |

As shown in Table 2, the bus-bar electrode 20 can have a surface roughness of about 10 μm by using 380 meshes per one inch used for screen printing and a wire having a diameter of ϕ14 μm. The bus-bar electrode 20 can have a surface roughness of about 20 μm by using 290 meshes and a wire having a diameter of ϕ20 μm. The bus-bar electrode 20 can have a surface roughness of about 20 μm by using 290 meshes and a wire having a diameter of ϕ20 μm. The bus-bar electrode 20 can have a surface roughness of about 30 μm by using 250 meshes and a wire having a diameter of ϕ30 μm.

By the manufacture method shown in the above comparison example, a solar cell module was prepared that had a conventional soldered connection structure.

The above 15 types of solar cell modules according to the Example and the comparison example were measured with regards to the outputs while being exposed to light of AM1.5 and 100 mW/cm2.

FIG. 5 is a graph plotting a normalized output with an average particle diameter of the conductive particles 70 on the horizontal axis with regards to the respective surface roughnesses of the bus-bar electrode 20. The normalized output means a value of the output of the solar cell module according to the Example when assuming that the output of the solar cell module according to the comparison example is 1 for normalization. As can be seen from the result of FIG. 5, the output is higher with an increase of the particle diameter of the conductive particles 70. The reason is that the conductive particles 70 having a larger particle diameter protrudes from the concave section of the collecting electrode to increase the ratio of the conductive particles 70 having a contact with the wiring member 40, thus reducing the contact resistance.

The experiment result shown in FIG. 5 was plotted with regards to a ratio between the surface roughness of the collecting electrode and an average particle diameter of the conductive particles 70. FIG. 6 is a graph illustrating normalized outputs by plotting, on the horizontal axis, values obtained by dividing an average particle diameter of the conductive particles 70 by the surface roughness of the collecting electrode defined by the ten points average height (average particle diameter/surface roughness). In a region in which the average particle diameter/surface roughness is smaller than 0.2, the output is smaller than that of the comparison example (i.e., is smaller than 1). The reason is that most of the conductive particles 70 are stored in the concave sections of the collecting electrode to prevent the conductive particles 70 from protruding from the concave sections, thus causing an insufficient contact between the conductive particles 70 and the wiring member 40. In a region in which the average particle diameter/surface roughness is 0.2 or more on the other hand, the output is larger than that of the comparison example (i.e., is larger than 1). The reason is that a part of the conductive particles 70 protrudes from the concave section of the collecting electrode to provide a sufficient contact between the conductive particles 70 and the wiring member 40 and that the nonexistence of flux eliminates resistance components of the residue of the flux. In a region in which an average particle diameter/surface roughness was 0.2 to 0.5, the output tends to increase. In a region in which an average particle diameter/surface roughness was 0.5 or more and 1.2 or less, an output 1.005 or more higher than that of the comparison example is obtained. The reason is that, with an increase of the particle diameter of the conductive particles 70 to the surface roughness of the collecting electrode, the conductive particle 70 protrudes from the concave section of the collecting electrode to increase the ratio of the conductive particles 70 having a contact with the wiring member 40, thus reducing the contact resistance. In a region in which an average particle diameter/surface roughness is 1.5 or more, the output tends to decrease on the contrary. The reason is that the conductive particles 70 sandwiched between the collecting electrode and the wiring member 40 to increase the distance between collecting electrode and the wiring member 40, thus causing an increased resistance loss. When the average particle diameter/surface roughness increases, it is assumed that the resistance loss is further increased to cause a reduced output. It is also assumed that the tendency of the changes in the output is caused by the ratio of the conductive particles 70 protruding from the concave section of the collecting electrode and the distance between the collecting electrode and the wiring member 40 and has no relation with the material of the conductive particles. It is assumed, however, that the output has an absolute value that is different depending on the resistivity of the conductive particles 70.

The comparison between the Example and the comparison example shows the following results. Specifically, the collecting electrode can be connected to the wiring member 40 for connecting the solar cells 50 by conductive paste without using flux. This eliminates the existence of flux residue as a resistance component at the joint section, thus providing a favorable electric connection.

Furthermore, a value obtained by dividing the average particle diameter of the conductive particles 70 by the surface roughness of the collecting electrode is determined to be within a range of 0.2 or more and 1.5 or less. This can reduce the electric resistance when compared with a case of the conventional connection by soldering. The range of 0.2 or more and 1.5 or less thus can further reduce electric resistance.

(Operation and Effects)

As described above, embodiments and the Example thereof of the present invention provides the following effects.

A solar cell module includes: the plurality of solar cells 50 that include collector electrodes (the finger electrode 30 and the bus-bar electrode 20) made of conductive paste respectively provided on an acceptance face and a back face opposing to the acceptance face of the photoelectric conversion part 10; the wiring member 40 for electrically connecting the bus-bar electrodes 20 of the plurality of solar cells 50; and the connection layer 80 provided between the bus-bar electrode 20 and the wiring member 40. The connection layer 80 is made of the resin 60 including the plurality of conductive particles 70. The bus-bar electrode 20 is electrically connected to the wiring member 40 by the conductive particles 70. The surface of the bus-bar electrode 20 having a contact with the connection layer 80 has a concavo-convex shape to cause the conductive particles 70 to protrude from the concave section at the surface of the bus-bar electrode 20.

The structure as described above can reduce, when compared with a case of the conventional connection by soldering, the electric resistance between the bus-bar electrode 20 and the wiring member 40 to suppress the module from having a reduced output.

Within a range of 1 mm on the surface of the bus-bar electrode 20 appearing in a cutting plane perpendicular to the surface of the collecting electrode (the bus-bar electrode 20), a value obtained by dividing the average particle diameter of the conductive particles 70 determined by the average value of the major axis of the conductive particles 70 by the surface roughness of the bus-bar electrode 20 determined by the ten points average height is within a range of 0.2 or more and 1.5 or less. As a result, electric resistance can be reduced when compared with a case of the conventional connection by soldering.

A value obtained by dividing the average particle diameter of the conductive particles 70 by the surface roughness of the bus-bar electrode 20 is within a range of 0.2 or more and 1.5 or less. This can further reduce electric resistance when compared with a case where this value is 0.2 or more and smaller than 0.5 and is higher than 1.2 and 1.5 or less.

The wiring member 40 having a contact with the connection layer 80 has thereon a layer softer than the conductive particles 70 (tin plating). This allows a pressure caused when the wiring member 40 is connected to the bus-bar electrode 20 to be absorbed by the layer softer than the conductive particles 70.

Other Embodiments

As described above, the present invention has been described by way of one embodiment and the Example thereof. However, it should not be understood that the description constituting a part of this disclosure and the drawings limit this invention. Various substitutive embodiments, Examples, and operation techniques will be clear for those skilled in the art from this disclosure.

The planar structure of the collecting electrode shown in FIG. 2 (electrode pattern) is a mere example and also may use other structures. For example, the plurality of finger electrodes 30 also may be arranged in a radial pattern instead of being arranged to be parallel to one another. In this case, the center or a part of the center at which the plurality of finger electrodes 30 are collected can provide the connection of the finger electrodes 30 to the bus-bar electrodes 20. As described above, various electrode patterns of collector electrodes for efficiently collecting the electricity generated by the light-receiving face of the photoelectric conversion part 10 can be achieved without reducing the light-receiving area of the photoelectric conversion part 10 in a more-than-necessary amount.

The present invention is not limited to the solar cell having the HIT structure exemplarily shown in FIG. 3. The present invention also can be used for the connection of electrodes of various solar batteries such as solar batteries having other HIT structures, a crystalline silicon-base solar battery (e.g., single-crystalline silicon, polycrystalline silicon), a thin film silicon solar battery (e.g., amorphous silicon, microcrystal silicon), a compound-base solar battery (e.g., GaAs, CuInse), an organic solar battery (e.g., dye sensitization), or a hybrid solar battery of the above batteries.

It should be understood that the present invention includes various embodiments for example that is not disclosed herein. Thus, the present invention is limited only by a subject matter sought to be patented according to claims applicable to this disclosure.

What is claimed is:

1. A solar cell module, comprising:
two solar cells, each including:
a photoelectric conversion part, wherein:
a first electrode formed of silver paste, comprising thin finger electrodes and a first bus bar electrode that interconnects the finger electrodes that is provided on the first main face; and
a second electrode comprising thin finger electrodes and a second bus bar electrode that interconnects the finger electrodes that is provided on any one of the first and second main faces and that has a polarity opposite to that of the first electrode;
a wiring member parallel to and laterally overlapping the first bus bar electrode for electrically connecting the first electrode of one solar cell of the two solar cells to the second bus bar electrode of the other solar cell; and
a connection layer that is provided between the first bus bar electrode and the wiring member and that is made of resin including a plurality of conductive particles having average particle diameters from about 6 microns to about 15 microns and suitable for completely bridging imperfections in the two contact surfaces, wherein:
the surface of the wiring member having a contact with the connection layer is softer than the conductive particles, wherein:
the first bus bar electrode is overlapped by the wiring member and is electrically connected to the wiring member by the conductive particles,
a surface of the first bus bar electrode having a contact with the connection layer and a concavo-convex shape that provides a space for the connection layer, and
among the plurality of conductive particles included in the connection layer, multiple conductive particles in concave sections at the surface of the first electrode protrude to the wiring member to have a height higher than the top of a surrounding convex sections, wherein each of the multiple conductive particles contacts both the first electrode and the wiring member, wherein
in a range of 1 mm of the surface of the first electrode appearing in a cutting plane perpendicular to the surface of the first electrode, a value obtained by dividing an average particle diameter of the conductive particles determined by an average value of a major axis of the conductive particles by a surface roughness of the first electrode determined by a ten points average height is within a range of 0.5 or more and 1.2 or less.

2. The solar cell module according to claim 1, wherein: the conductive particles comprise nickel and the wiring member having a contact with the connection layer comprises copper with a tin surface.

3. The solar cell module according to claim 1, wherein the plurality of conductive particles included in the connection layer dispersively exist at a low concentration in the resin into allow individual particle bridging the first electrode and the wiring member.

4. The solar cell module according to claim 3, wherein the connection layer contains 5% or less by volume of the conductive particles.

5. The solar cell module according to claim 1, wherein the resin included in the connection layer is thermosetting conductive resin.

6. The solar cell module according to claim 5, wherein the resin is at least one kind of resin selected from epoxy resin, acrylic resin, polyimide resin, phenolic resin, urethane resin and silicone resin, or a copolymer of two or more kinds of resin selected from epoxy resin, acrylic resin, polyimide resin, phenolic resin, urethane resin and silicone resin.

7. The solar cell module according to claim 1, wherein the first electrode is made of conductive paste.

8. The solar cell module according to claim 7, wherein the first electrode is made of thermosetting conductive paste.

9. The solar cell module according to claim 1, wherein
the first electrode is made of conductive paste of the resin type, and
the first electrode and the connection layer include the resin of the same type.

10. The solar cell module according to claim 9, wherein the resin of the same type is a resin of at least either of epoxy resin or acrylic resin.

11. The solar cell module of claim 1, wherein the plurality of conductive particles are sized to form single particle spacing between the first electrode and the wiring member.

12. The solar cell module according to claim 1, wherein the surface of the first electrode having a contact with the connection layer has a roughness of 10 μm or more.

13. The solar cell module according to claim 1, wherein the bus bar electrode is flat.

14. The solar cell module according to claim 1, wherein the two solar cells are connected by wiring member in the absence of a solder connection.

15. The solar cell module according to claim 1, wherein the collecting electrode is connected to the wiring member by conductive paste without the presence of flux.

16. The solar cell module according to claim 15, wherein the particles comprise nickel.

17. A solar cell module, comprising:
two solar cells, each including:
a bus bar electrode that conducts current from a photoelectric conversion part and a wiring member that electrically connects the solar cells via a connection layer, wherein:
the connection layer is between a first bus bar electrode formed of silver paste on a first solar cell and a wiring member that connects the first solar cell to a second solar cell and that is made of resin including a plurality of conductive particles having average particle diameters from about 6 microns to about 15 microns and suitable for completely bridging imperfections in the two contact surfaces, wherein:
- the first bus bar electrode is overlapped by the wiring member and is electrically connected to the wiring member by individual conductive particles wherein the surface of the wiring member having a contact with the connection layer via individual conductive particles is softer than the conductive particles,
- a surface of the first bus bar electrode having a concavo-convex shape that provides a space for the connection layer, and
- among the plurality of conductive particles included in the connection layer, individual conductive particles in concave sections at the surface of the first electrode protrude to the wiring member with a height higher than the top of surrounding convex sections, wherein each of conductive particle contacts both the first electrode and the wiring member, and wherein:
- in a range of 1 mm of the surface of the first electrode appearing in a cutting plane perpendicular to the surface of the first electrode, a value obtained by dividing an average particle diameter of the conductive particles determined by an average value of a major axis of the conductive particles by a surface roughness of the first electrode determined by a ten points average height is within a range of 0.5 or more and 1.2 or less, and thereby allowing individual particles to bridge and electrically contact both the first electrode and the wiring member.

* * * * *